United States Patent [19]

Ausschnitt

[11] 4,437,760
[45] Mar. 20, 1984

[54] REUSABLE ELECTRICAL OVERLAY MEASUREMENT CIRCUIT AND PROCESS

[75] Inventor: Christoper P. Ausschnitt, Southport, Conn.

[73] Assignee: The Perkin-Elmer Corp., Norwalk, Conn.

[21] Appl. No.: 327,862

[22] Filed: Dec. 7, 1981

[51] Int. Cl.³ .................. G03B 27/32; G03B 27/42
[52] U.S. Cl. .................................. 355/133; 355/77; 355/53
[58] Field of Search ..................... 355/77, 133, 53

[56] References Cited

U.S. PATENT DOCUMENTS

| | | | |
|---|---|---|---|
| 3,743,417 | 7/1973 | Smatlak | 355/133 |
| 3,771,872 | 11/1973 | Nightingale et al. | 355/133 |
| 3,873,203 | 3/1975 | Stevenson | 355/133 |
| 3,914,050 | 10/1975 | Dost et al. | 355/133 |
| 4,286,871 | 9/1981 | Erickson | 355/133 |

OTHER PUBLICATIONS

IEEE Transactions on Electron Devices, vol. ED-26 No. 4 Apr., 1979 pp. 729-732.
Journal of Electrochemical Society: *Solid-State Science and Technology*, Apr., 1978 pp. 650-654.
*IEEE Journal of Solid-State Circuits*, vol. SC-13 Aug., 1978 pp. 436-444.
SPIE vol. 334 Optical Microlithography-Technology for the Mid-1980's (1982) pp. 2-16.
Technical Digest 1977 International Electron Devices Meeting Dec. 5-7 (1977) pp. 7A-7F.

*Primary Examiner*—Monroe H. Hayes
*Attorney, Agent, or Firm*—S. A. Giarratana; E. T. Grimes; T. P. Murphy

[57] ABSTRACT

A reusable electric overlay measurement base pattern includes a pair of current pads forming first and second pads adapted to be contacted by point contacts, a first conductor of controlled width extending between the first and second pads, a pair of voltage pads forming third and fourth pads suitable for contacting by point contacts, two second conductors extending from the third and fourth pads to the first conductor contacting the first conductor at a predetermined spacing, and a fifth pad disposed adjacent and spaced from said first conductor approximately at the midpoint between the two second conductors. This permits a second level conductor to be deposited extending between the fifth pad and said first conductor which, when perfectly aligned, will intersect the first conductor at its midpoint. The misalignment of the second level conductor can be detected by measurements using the five pads. All of the four pads which are interconnected, along with the fifth pad are made of a conductive material which is resistant to an etchant which can be used in conjunction with the second level conductive layer which is of a different conductive material to remove the second metal layer after use thereby permitting reuse of the first layer.

15 Claims, 10 Drawing Figures

DEPOSIT Ti

PATTERN Ti (REFERENCE PATTERN)

DEPOSIT Cr

PATTERN Cr (OVERLAY PATTERN)

ETCH Cr

DEPOSIT Ti

PATTERN Ti
(REFERENCE PATTERN)

DEPOSIT Cr

PATTERN Cr
(OVERLAY PATTERN)

ETCH Cr

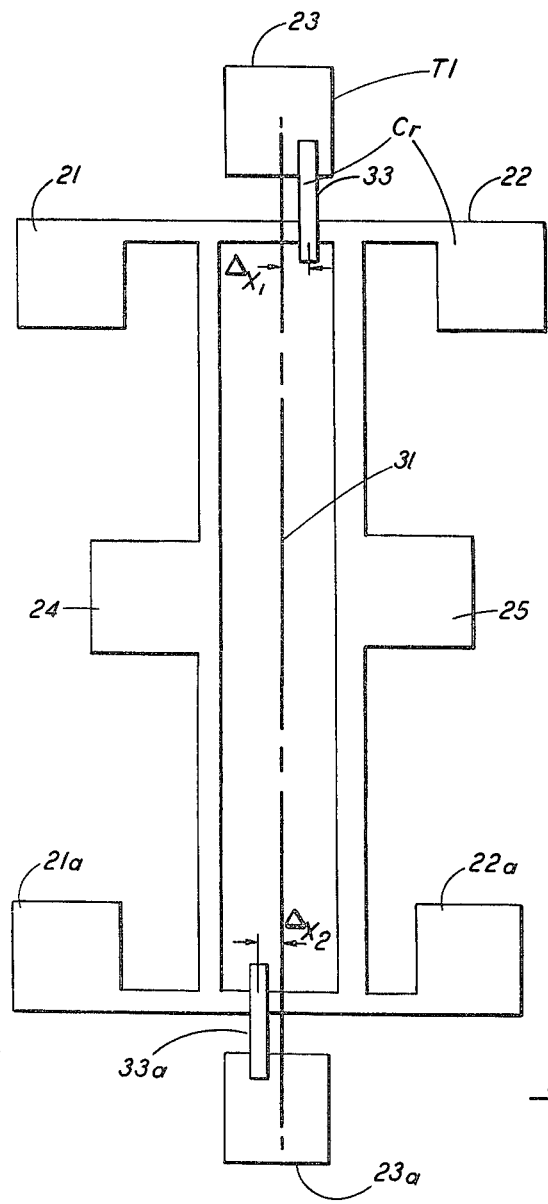
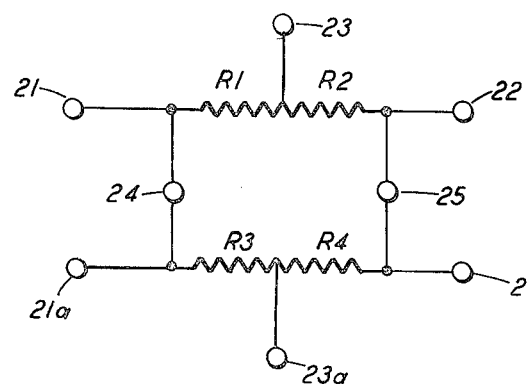
FIG. 4
FIG. 5

REUSABLE ELECTRICAL OVERLAY MEASUREMENT CIRCUIT AND PROCESS

This invention relates to microcircuits in general and more particularly to a reusable electrical overlay measurement circuit and process which is useful for testing lithographic equipment used in making microcircuits.

In a typical microcircuit there are seven layers of patterning. The size of a microcircuit is determined by the minimum possible line width and line spacings which can be obtained. These in turn are, in part, determined by the accuracy with which one pattern can be placed on top of another. The smaller the error in overlay placement the greater the packing density which can be achieved. Typically, machines now being made for projection lithography have specifications of the order of ½ micron. This error is made up of two factors. One is an alignment error and the other is a distortion error. Alignment error is determined by the ability of the operator or automatic alignment system of the machine to position one pattern level over another. Distortion is the error inherent in the imaging system of the machine. It is desired to be able to measure both types of error and to maintain accuracy within the prescribed limit with respect to both.

It is necessary that overlay accuracy measurements be made during production and initial calibration of machines and also periodically in service to assure that accuracy is being maintained. One way that this has been done in the past was to print vernier patterns on a substrate and optically to read these patterns. For example, a pattern consisting of a set of lines with a pitch of 10 microns would be placed next to another pattern with a pitch of 9.75 microns. If overlay were perfect, the two sets of lines would line up at their center and, going out from the center, each line of the second pattern would be progressively closer to the center than the corresponding line of the first pattern. If overlay were in error by 0.25 μm, then the two sets of lines would line up at a position displaced by one line from the pattern center.

Furthermore, in carrying out the measurements of this nature it should be noted that measurements are taken at a plurality of sites on a wafer and that checks are made in both the X and Y direction.

The main problem with optical measurements, other than the fact that they depend on human operators, is that they are limited in accuracy. In the above example, it is only possible to read to a quarter of a micron and to interpolate to an eighth of a micron. Thus, there have been proposals to utilize electrical techniques. The advantage of electrical techniques is that they permit automated and more accurate measurements utilizing probes at appropriate stations. Examples of literature describing prior art electrical measurement techniques are the following:

*Solid State Technology*, "Microelectronic Test Structures for Characterizing Fine-Line Lithography," D. S. Perloff, T. F. Hasan, D. H. Hwang and J. Frey, May, 1981, pp. 126-129 and 140.

*Solid State Technology*, "Use of Microelectronic Test Structures to Characterize IC Materials, Processes, and Processing Equipment," G. P. Carver, L. W. Linholm and T. J. Russell, September, 1980, pp. 85-92.

*Solid State Technology*, "Real-Time Minitoring of Semiconductor Process Uniformity," D. S. Perloff, T. F. Hasan and E. R. Blome, February, 1980, pp. 81-86.

*Solid-State Science and Technology*, "Alignment, and Mask Errors in IC Processing," K. H. Nicholas, I. J. Stemp and H. E. Brockman, March, 1981, pp. 609-614.

*Fifteenth Symposium on Electron, Ion and Phonton Beam Technology*, "Performance Limits in 1:1 UV Projection Lithography," J. H. Bruning, May, 1979, pp. 1-8.

However, in the resistance measurements which are known in the prior art, first and second levels of a conductor are constructed such as to obtain a pair of resistors which, if the overlay is perfect will have equal values. The difference in resistance value is a measure of the offset error. However, using these prior art techniques, the first or base level was destroyed, by the overlay of the second layer, each time a test was carried out. This required having a large plurality of base patterns constructed for testing. However, it is difficult reproducibly and accurately to make base patterns. The base pattern must be as distortion-free as possible. This is normally accomplished by contact printing. However, there is a limit to the number of circuits which can be contact printed with a master mask. Thus, the ideal would be a base pattern which could be used over and over again for calibration, maintenance and so forth. With such a base pattern, since the same base pattern would be used from time to time, any changes would be caused by changes in the apparatus being tested and could not be attributed to a new base pattern. Over a period of time, in addition to saving time and money, the availability of a reusable base pattern would insure better accuracy and repeatability.

SUMMARY OF THE INVENTION

The present invention provides a reusable base pattern for carrying out electrical overlay measurements and also describes a process of making and using such a base pattern. In accordance with the present invention, this is accomplished by using two different electrically conductive materials to construct a resistor bridge circuit whose electrical characteristics are sensitive to overlay error. The first or base level reference pattern is defined in the film of a first metal deposited on an insulating substrate. The second level pattern is defined in a film of a second metal deposited over the reference pattern. The second level pattern completes the bridge circuit which can then be measured electrically to determine the location of the second pattern with respect to the first. In accordance with the present invention, the second level pattern in the second metal is capable of being removed from the first level pattern without affecting the first level pattern. This, thus, permits the first level pattern to be reused indefinitely. One example of metals which may be used are titanium as the first metal and chromium as the second metal. The titanium is thermally deposited, i.e., vapor deposited, in a 1000 Å film, pattern using standard lithographic processes and etched with a dilute HF etch. Over the first layer, a 1000 Å film of chromium is then sputter deposited. The chromium is also patterned using standard lithographic processes and a chromium mask etchant commercially available from Transene, Inc. This chromium etchant does react with the titanium pattern even when the two are in direct contact. The pattern obtained is then electrically measured to determine the offset errors. An electrical measurement system capable of measuring nominal resistance to plus or minus 0.1% is available resulting, with the particular dimensions described in detail below, in an overlay measurement accuracy of 0.01 micron. Upon completion of the measurement, the remaining chromium is etched off the first level titanium pattern so that the substrate with the titanium on it can again be used. In comparisons between measurements made with the method of present invention and measurements made optically, agreement within plus or minus 0.125 microns, the available optical accuracy was obtained.

Although titanium and chromium are prefered presently, it is believed that other combinations such as polysilicon or platinum silicide and chromium may also be used.

BRIEF DESCRIPTION OF THE DRAWINGS

FIG. 4 is an improved layout for obtaining more accurate measurements.

FIG. 5 is the electrically equivalent circuit of FIG. 4.

DETAILED DESCRIPTION OF THE INVENTION

Figure 1A:
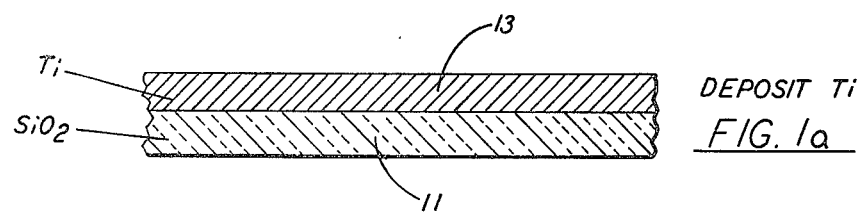
FIG. 1a is a cross-sectional view of the substrate containing thereon a layer of titanium.
Figure 1B:
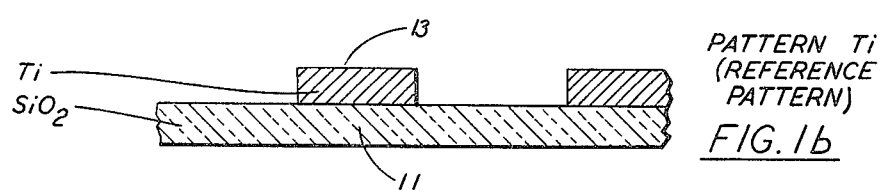
FIG. 1b shows the cross-sectional view after the titanium has been patterned.
Figure 1C:
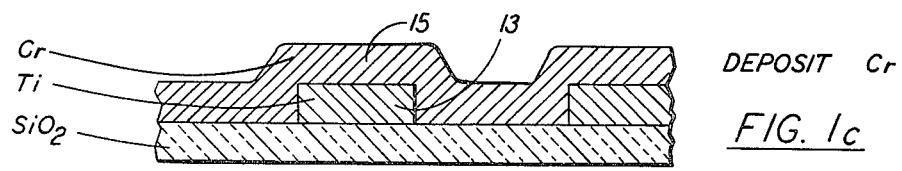
FIG. 1c is a similar view showing the layer of chromium deposited thereover.
Figure 1D:
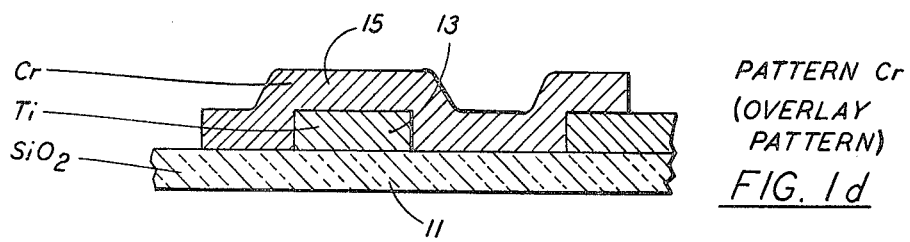
FIG. 1d shows the chromium after being patterned.
Figure 1E:
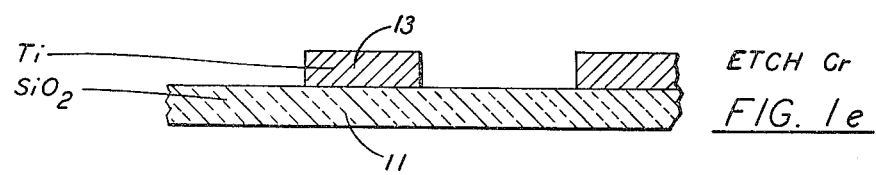
FIG. 1e shows the substrate after all of the chromium has been removed.

In accordance with the present invention, an insulating substrate, such as the substrate 11 of FIG. 1a, has deposited thereover a film of titanium approximately 1000 Å thick. Assuming the substrate is the conventional wafer size which is typically used to make a plurality of microcircuits, there will be a plurality of sites established throughout the wafer. The titanium 13 will be coated with a suitable photo-resist and, preferably by contact printing using a master mask, and conventional etching techniques, the titanium is patterned to obtain, at a plurality of sites, a reference pattern of titanium 13 on the insulating substrate 11 as illustrated by FIG. 1b. Thereafter, a layer 15 of chromium, again, about 1000 Å thick is deposited over the titanium 13 as shown in FIG. 1c. Preferably the titanium deposit is carried out by vapor deposition and the chromium deposit by sputtering. However, any depositing techniques used in the art may be used in carrying out the present invention. The chromium is then patterned using conventional photolithographic techniques to obtain patterned chromium 15 over patterned titanium 13 on the substrate 11 as shown in FIG. 1d. Electrical measurements are then taken in the manner to be described below. After the necessary measurements are made, the remaining chromium is etched to end up with what is shown in FIG. 1e, i.e., the titanium pattern 13 on the substrate 11, the same pattern as is shown in FIG. 1b thereby permitting the steps illustrated by FIGS. 1c, 1d, and 1e to be continually repeated.

Figure 2:
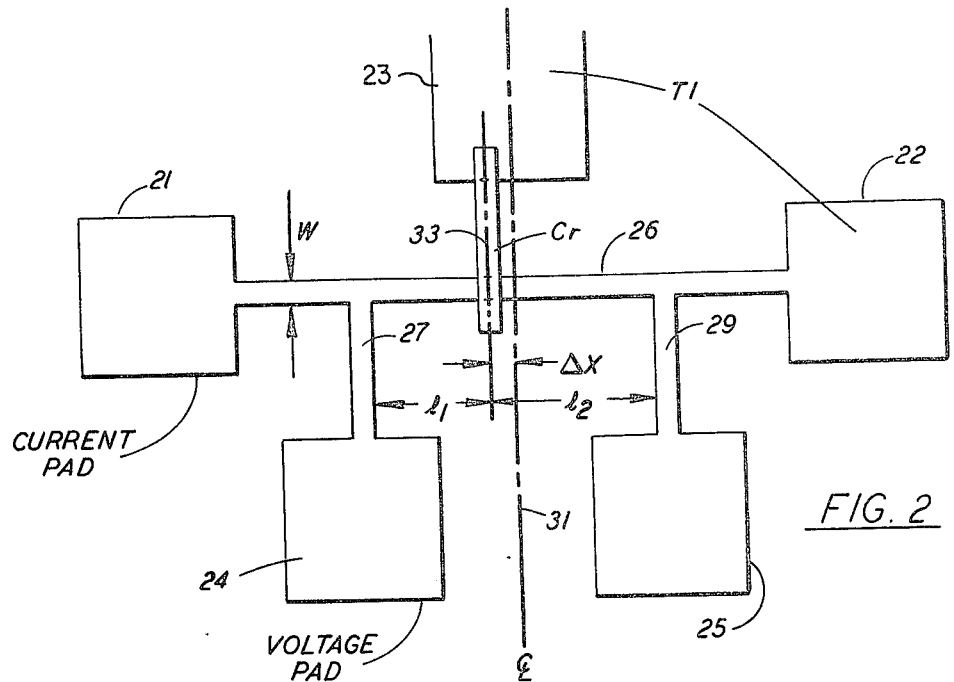
FIG. 2 is a plan view of a measurement site on the substrate after both the titanium and chromium have been deposited.
Figure 3:
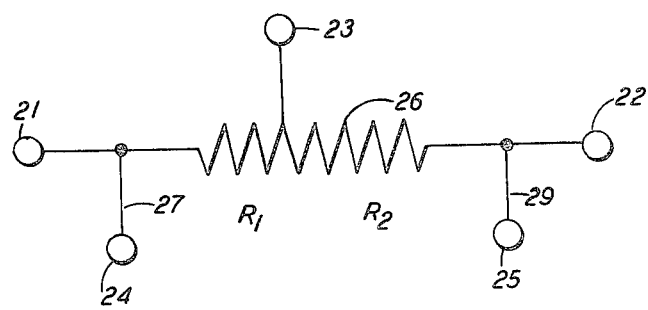
FIG. 3 is an equivalent circuit of the arrangement shown in FIG. 2.

FIG. 2 illustrates, in plan view, a reference pattern in titanium with an overlay pattern of a strip of chromium 33 for one site and for making an X measurement. Patterns will, of course, be repeated at many sites and half of the patterns rotated 90° to that shown in the Figure in order to make both X and Y measurements. The titanium pattern includes, in the embodiment of FIG. 2, five pads 21–25 along with a conductor 26 of width w joining pads 21 and 22, with branches from this conductor designated as 27 and 29 going to pads 24 and 25. The equivalent circuit of this arrangement is shown in FIG. 3. The pads 21–25 are used for electrical probes. A known current is caused to flow through the conductor 26 from pad 21 to pad 22. Voltage measurements are taken off at pads 23, 24, and 25. Pad 23 lies on a center line 31. If the overlay of chromium is in perfect alignment, the chromium strip 33 extends between conductor 26 and pad 23, i.e, strip of chromium 33 is deposited directly on the center line 31. However, in the illustrated embodiment the strip of chromium 33 which connects the pad 23 with the conductor 26 is offset by an amount $\Delta x$. The distance of the center line of the strip 33 from the connecting conductor 27 is $l_1$ and the distance from the conductor 29 is $l_2$.

In the equivalent circuit of FIG. 3, the resistance between the center line of strip 33 and the conductor 27 is represented as $R_1$ and the resistance between the chromium strip 33 and the conductor 29 as $R_2$. Obviously, if the strip of chromium 33 is in the exact proper position on the center line 31, these two resistances will be equal. If the current flowing through the resistance, i.e., flowing through the conductor 26 is designated as I, then the voltage drop between pads 23 and 24 will be $IR_1$ and the voltage drop between pads 23 and 25 will $IR_2$. Designating the voltage between pads 23 and 24 as $V_1$ and that between pads 23 and 25 as $V_2$ it will be seen that: $R_1 = V_1/I$, and $R_2 = V_2/I$. The offset $\Delta x$ will be: $\Delta x = l_0(R_1 - R_2)/(R_1 + R_2)$, where $l_0 = (l_1 + l_2)/2$.

The dimension $l_0$ is a constant independent of pattern offset. In the embodiment illustrated in FIG. 2, $l_0$ is equal to 10 microns and w is equal to 2 microns. The sheet resistance of titanium is approximately equal to 10 $\Omega$/square. Consequently the nominal resistance is $(R_1 + R_2)/2 = 200\Omega$. The measurement system used is capable of measuring the nominal resistance to plus or minus 0.1%. With the values given this electrical measurement accuracy corresponds to an overlay measurement accuracy of plus or minus 0.01 microns.

FIGS. 4 and 5 correspond to FIGS. 2 and 3 illustrating a further improvement in the present invention. In the illustrated arrangement the pads 21–25 are the same as before. However, in addition there are three more pads 21a, 22a, and 23a. Again, current is caused to flow between pads 21a and 22a and voltage measurements made between pads 23a and 24 and pads 23a and 25. In addition to the strip of chromium 33 another strip 33a at the other end is placed on the titanium layer. The strips 33 and 33a are offset mutually on both sides of the center line 31. Thus, in this arrangement:

$$\Delta x_1 = l_0(R_1 - R_2)/(R_2 + R_1).$$

Similarly:

$$\Delta x_2 = l_0(R_3 - R_4)/(R_3 + R_4).$$

The offset between strips 33 and 33a is set to be 2 microns, i.e., 1 micron on each side of the center line. Thus:

$$\Delta x_1 - \Delta x_2 = 2 \text{ microns}.$$

The overall offset error will be:

$$\Delta x = \Delta x_1 + \Delta x_2 / 2.$$

From these equations it is possible accurately to determine $l_0$ and to account for errors which result because of nonuniformities in the patterning process and the fact that the contacts have a finite size.

Referring to FIG. 4, assume that the overlay error was 1 micron to the right. In that case, the strip 33a would be right on the center line 31 and the strip 33 would be 2 microns to right instead of 1 micron to the right as it should be. From the resistance measurements, $\Delta x_2$ would be determined to be 0 and $\Delta x_1$ to be equal to 2. The sum of these two divided by 2 gives the desired result of 1 micron error. When the two are exactly where they should be they will be respectively plus 1 micron and minus 1 micron. These two values cancel out to give a value of 0 for $\Delta x_0$.

Returning to the above example of a 1 micron error, note that in the example discussed above it was indicated that $l_0$ is equal to 10 microns. Suppose, due to error, $l_0$ was actually 11 microns. In the example given by FIGS. 2 and 3, a 1 micron error would then appear as a 1.1 micron error. However, in the example just given this error can be avoided by finding the actual value of $l_0$ through a substitution of equations $\Delta x_1 = l_0(R_1 - R_2)/(R_2 + R_1)$ and $\Delta x_2 = l_0(R_3 - R_4)/(R_3 + R_4)$ into equation $\Delta x_1 - \Delta x_2 = 2$ microns to solve for $l_0$. Equations $\Delta x_1 = l_0(R_1 - R_2)/(R_2 + R_1)$ and $\Delta x_2 = l_0(R_3 - R_4)/(R_3 + R_4)$ can then be solved for $\Delta x_1$ and $\Delta x_2$ whereafter the true value of the error $\Delta x$ will be found.

Furthermore, the balanced bridge pattern shown in FIGS. 4 and 5 has the advantage that the relationship $R_1 + R_2 = R_3 + R_4$ must hold independent of the overlay error. Thus, verification of the above relationship at each measurement site gives an immediate check of measurement error and provides a means of detecting defective test patterns on the wafer.

Figure 6:
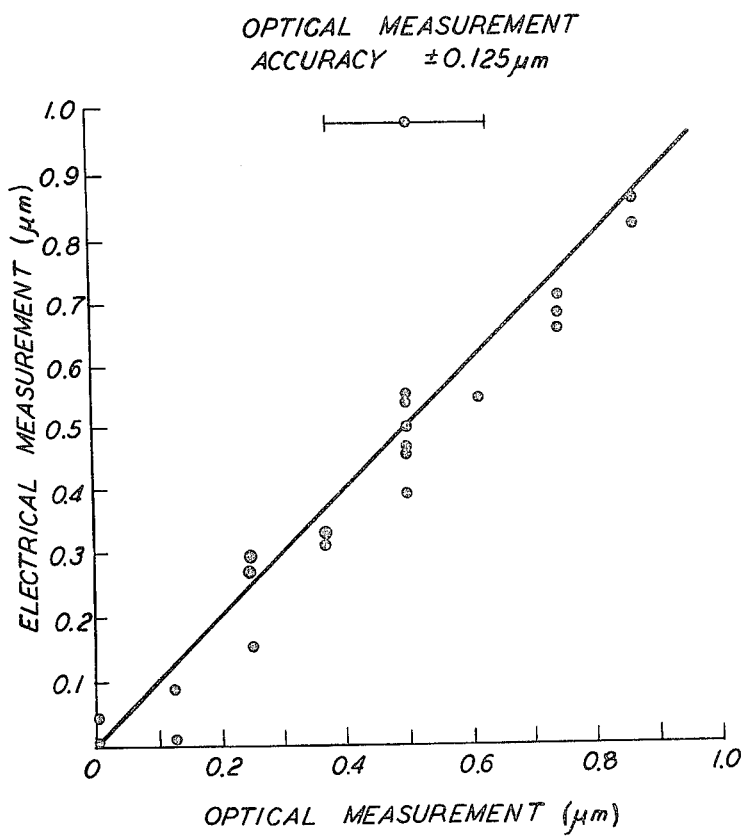
FIG. 6 is a graph showing the variation between optical measurement accuracy and electrical measurement accuracy on a recycled titanium first layer after the third cycle.

FIG. 6 is a plot showing a comparison between electrical measurements and optical measurements with recycled titanium on the third cycle. It must be borne in mind that the optical measurement as indicated on the Figure is only accurate to plus or minus 0.125 μm. With recycling, no degradation of the titanium patterns was observed and the optical and electrical readings agreed within the plus or minus 0.125 micron accuracy of the optical measurements.

What is claimed is:

1. A reusable electric overlay measurement base pattern comprising:
   (a) a pair of current pads forming first and second pads adapted to be contacted by point contacts;
   (b) a first conductor of controlled width extending between said first and second pads;
   (c) a pair of voltage pads forming third and fourth pads suitable for contacting by point contacts;
   (d) two second conductors extending from said third and fourth pads to said first conductor, said second conductors contacting said first conductor at a predetermined spacing;
   (e) a fifth pad disposed adjacent and spaced from said first conductor approximately at the midpoint between said two second conductors;
   (f) a second level conductor extending between said fifth pad and said first conductor; the misalignment of said second level conductor being detected by measurements using said five pads;
   (g) all of said four pads which are interconnected, along with said fifth pad, being made of a metal which is resistant to an etchant which can be used in conjunction with a second level conductive layer to remove the second conductive layer after use.

2. A circuit according to claim 1, wherein said conductor of said base pattern is selected from the group consisting of titanium, polysilicon and platinum silicide.

3. A circuit according to claim 1 or 2 and further comprising: sixth and seventh pads; a second current conductor extending between said sixth and seventh pads parallel to said first current conductor; third and fourth voltage conductors coupling said sixth and seventh pads to points spaced apart on said second current conductor a distance equal to the spacing of the points on said first current conductor; and an eighth pad opposite the midpoint between the points of contact of the said third and fourth voltage conductors with said second current conductor, first and second level patterns disposed over said base pattern extending between said fifth and eighth pads and said first and second current conductors, respectively to form a bridge circuit.

4. A circuit according to claim 1, wherein said base pattern is formed at a plurality of different sites on a silicon chip.

5. A circuit according to claim 4, wherein said first current conductor extends in a first direction and further including an additional circuit at each of said sites having a current conductor extending in a direction orthogonal thereto whereby alignment measurements along two axes may be made.

6. A circuit according to claim 1, and further including, for use with said circuit, a mask for exposing second level conductor sites.

7. In a method of checking the alignment of projection optical equipment used to manufacture microcircuits which includes the steps of forming a base conductor pattern including a plurality of measurement pads which can be contacted by point sensors; exposing and forming thereover a second level of conductors; and measuring electrical parameters to determine the offset of conductors of said second level from a desired position, the improvement comprising:
   (a) forming said base pattern and second level of different conductors;
   (b) forming said base pattern of a conductor which is resistant to the etchant used with said second level conductors; and
   (c) after making a measurement, etching said second level pattern off of said base pattern whereby said base pattern will be reusable.

8. The method according to claim 7, wherein the conductor of said base pattern is selected from the group consisting of titanium, polysilicon and platinum silicide.

9. The method according to claim 8, wherein said second level pattern is chromium.

10. The method according to claim 9, wherein said first level conductor is titanium.

11. The method according to claim 10, comprising depositing said chromium by sputtering and said titanium by vapor deposition.

12. The method according to claim 7, wherein said base pattern and second level form a bridge and further comprising mutually offsetting the conductors of said second level from a nominal centerline to permit more accurate measurement.

13. An electric overlay measurement base pattern comprising:
 (a) a pair of current pads forming first and second pads adapted to be contacted by point contacts;
 (b) a first conductor of controlled width extending between said first and second pads;
 (c) a pair of voltage pads forming third and fourth pads suitable for contacting by point contacts;
 (d) two second conductors extending from said third and fourth pads to said first conductor, said second conductors contacting said first conductor at a predetermined spacing;
 (e) a fifth pad disposed adjacent and spaced from said first conductor approximately at the midpoint between said two second conductors;
 (f) a second level conductor, extending between said fifth pad and said first conductor;
 (g) sixth and seventh pads;
 (h) a second current conductor extending between said sixth and seventh pads parallel to said first current conductor;
 (i) third and fourth voltage conductors coupling said sixth and seventh pads to points spaced apart on said second current conductor a distance equal to the spacing of the points on said first current conductor; and
 (j) an eighth pad opposite the midpoint between the points of contact of the said third and fourth voltage conductors with said second current conductor;
 (k) first and second level patterns disposed over said base pattern extending between said fifth and eighth pads and said first and second current conductors, respectively, to form a bridge circuit.

14. A circuit according to claim 13, wherein said base pattern is formed at a plurality of different sites on a silicon chip.

15. A circuit according to claim 14 wherein said first current conductor extends in a first direction and further including an additional circuit at each of said sites having a current conductor extending in a direction orthogonal thereto whereby alignment measurements along two axes may be made.

* * * * *